(12) United States Patent
Tsai et al.

(10) Patent No.: US 6,646,924 B1
(45) Date of Patent: Nov. 11, 2003

(54) NON-VOLATILE MEMORY AND OPERATING METHOD THEREOF

(75) Inventors: Wen-Jer Tsai, Hualian (TW); Chih-Chieh Yeh, Taipei (TW); Tao-Cheng Lu, Kaoshiung (TW)

(73) Assignee: Macronix International Co, Ltd., Hsinchu (TW)

( * ) Notice: Subject to any disclaimer, the term of this patent is extended or adjusted under 35 U.S.C. 154(b) by 0 days.

(21) Appl. No.: 10/064,642

(22) Filed: Aug. 2, 2002

(51) Int. Cl.[7] .............................................. G11C 16/04
(52) U.S. Cl. .............................. 365/185.28; 365/185.26
(58) Field of Search ........................ 365/185.28, 185.13, 365/185.16, 185.26, 185.29, 185.11

(56) References Cited

U.S. PATENT DOCUMENTS 5,371,031 A * 12/1994 Gill et al. .............. 365/185.02
5,889,698 A * 3/1999 Miwa et al. ........... 365/185.03
6,014,329 A * 1/2000 Akaogi et al. ......... 365/185.09

* cited by examiner

Primary Examiner—Thong Q. Le
(74) Attorney, Agent, or Firm—Jiang-Chyun IP Office (57) ABSTRACT

A non-volatile memory is described, which comprises a plurality of memory cells, a plurality of word lines, a plurality of drain lines and a plurality of source lines. Two adjacent memory cells in the same row share a source and are grouped into a cell pair, and all of the cell pairs are arranged in rows and columns, wherein two cell pairs in the same row share a drain. The sources of the memory cells in the same row are connected to a source line, and the drains of the memory cells in the same row are connected to a drain line. The gates of the memory cells in the same column are coupled to a word line.

23 Claims, 6 Drawing Sheets

NON-VOLATILE MEMORY AND OPERATING METHOD THEREOF

BACKGROUND OF INVENTION

1. Field of Invention

The present invention relates to a non-volatile memory and a method for operating the same. More particularly, the present invention relates to an electrically erasable programmable read-only memory ($E^2$ PROM) capable of storing two bits in one cell and a method for operating the same.

2. Description of Related Art $E^2$ PROM can be programmed, read, and erased repeatedly and can retain data even if disconnected from power supply, and therefore is widely used in personal computers and electronic apparatuses.

A conventional $E^2$ PROM uses a floating gate and a control gate both made from doped polysilicon, and is programmed by injecting charges into its floating gate. Since doped polysilicon is electrically conductive, the charges distribute evenly in the floating gate after programming. Consequently, a leakage easily occurs in the memory cell if there are defects in the tunnel oxide layer under the floating gate, and the reliability of the device is thus lowered.

To solve the leakage problem of the conventional $E^2$ PROM, a charge-trapping layer is recently developed to replace the polysilicon floating gate in the conventional flash memory. The charge-trapping layer usually comprises a silicon nitride layer that is disposed between two silicon oxide layers to form an oxide/nitride/oxide (ONO) composite layer, while the memory with a nitride charge-trapping layer is known as a "nitride read-only memory (NROM)". In an NROM, the nitride charge-trapping is able to trap charges so that the injected charges will not distribute evenly in the charge-trapping layer, but will be localized in a region of the charge-trapping layer near the charge injection side. Because the injected charges are localized, the charge-trapping region is small and is less likely to locate on the defects of the tunnel oxide layer. A leakage therefore does not easily occur in the device.

Besides, since charges are localized in a region of the charge-trapping layer near the drain or the source, the NROM is capable of storing two bits in one memory-cell. This is achieved by, for example, changing the direction of channel current and thereby varying the generating site and the injecting region of hot electrons as the channel hot electron injection (CHEI) mechanism is used for programming. Particularly, if a higher bias is applied to the first source/drain region of the memory cell, hot electrons will be generated and be injected into the charge-trapping layer near the first source/drain region. Similarly, if a higher bias is the applied to the second source/drain region, hot electrons will be generated and be injected into the charge-trapping layer near the second source/drain region. Thus, a memory cell can be configured into one of the four states, in which each of the two ends of the charge-trapping layer may have one group of electrons or have zero electron trapped in it.

Figure 1:
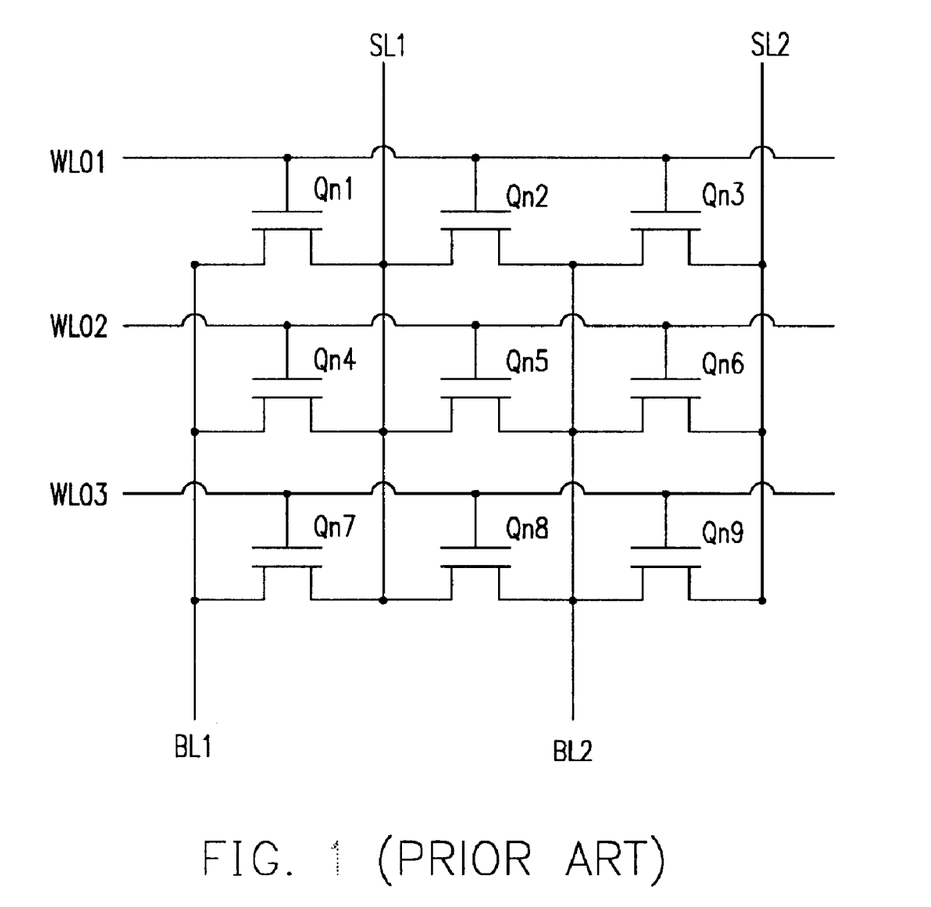
FIG. 1 illustrates a local circuit diagram of a non-volatile memory in the prior art.

FIG. 1 illustrates a local circuit diagram of a NROM in the prior art, which is also disclosed in U.S. Pat. No. 5,966,603. The example illustrated in FIG. 1 is a 3×3 array that includes memory cells Qn1~Qn9 coupled to word lines WL01~WL03, bit lines BL1 and BL2, and source lines SL1 and SL2. The drains of Qn1, Qn4 and Qn7 are coupled to BL1, and the drains of Qn2, Qn3, Qn5, Qn6, Qn8 and Qn9 are coupled to BL2. The sources of Qn1, Qn2, Qn4, Qn5, Qn7 and Qn8 are coupled to SL1, and the sources of Qn3, Qn6 and Qn9 are coupled to SL2. The gates of the memory cells in the same row are connected to a word line, i.e., the gates of Qn1~Qn3 are coupled to WL01, the gates of Qn4~Qn6 to WL02, and the gates of Qn7~Qn9 to WL03.

Refer to FIG. 1, in each row of memory cells, the gates of the cells are coupled to the same word line, each cell shares its source and drain with two adjacent cells, and the sources (or drains) of the cells are coupled to different source lines (or bit lines). Therefore, it is necessary to apply different biases to different source lines or bit lines as a specific memory cell is to be programmed, and the programming process is quite complicated.

For example, when the source side of Qn5 is being programmed, WL02, SL1 and BL2 are applied with 5V, 5V and 0V, respectively, to induce band-to-band hot hole phenomenon and thereby inject hot holes into the charge-trapping layer on the source side. However, when the source side of Qn5 is being programmed, the bit line BL1 coupled to Qn4 must be applied with 3V to prevent programming of Qn4 since Qn4 and Qn5 both are coupled to WL02 and SL1. Similarly, when the drain side of Qn5 is being programmed, WL02, BL2 and SL1 are applied with 5V, 5V and 0V, respectively, to induce band-to-band hot hole phenomenon and thereby inject hot holes into the charge-trapping layer on the drain side. However, when the drain side of Qn5 is being programmed, the source line SL2 coupled to Qn6 must be applied with 3V to prevent programming of Qn6 since Qn6 and Qn5 both are coupled to WL02 and BL2. Accordingly, the programming process is quite complicated.

Moreover, since the conventional NROM of 2 bits/cell type uses buried bit lines and buried source lines that have high resistance, the operating speed of the memory device cannot be raised.

SUMMARY OF INVENTION

In view of the above mentioned, this invention provides a non-volatile memory and a method for operating the same. In the method, the programming operation of a memory cell does not interfere with other cells, and the memory can be programmed with a bit, a byte or a sector as a unit.

A non-volatile memory of this invention comprises a plurality of memory cells, a plurality of word lines, a plurality of drain lines and a plurality of source lines. Two adjacent memory cells in the same row share a source and are grouped into a cell pair, and all cell pairs are arranged in rows and columns, wherein two cell pairs in the same row share a drain. The sources of the memory cells in the same row are connected to a source line, and the drains of the memory cells in the same row are connected to a drain line. In addition, the gates of the cells in the same column are coupled to a word line.

The non-volatile memory of this invention further comprise a plurality of source line select transistors, a plurality of drain line select transistors, a plurality of source line select lines, a plurality of drain line select lines, a global source line (GSL) and a global drain line (GDL). Each source line select transistor is coupled between the global source line (GSL) and a source line, and the gate of the source line select transistor is coupled to a source line select line. Analogously, each drain line select transistor is coupled between the global drain line (GDL) and a drain line, and the gate of the drain line select transistor is coupled to a drain line select line.

In the non-volatile memory of this invention, the source line and the drain line can comprise a low-resistance material such as metal. Since the sources/drains of the memory cells in the same rows are electrically connected to a source/drain line, the resistance of the memory array is lower and the operating speed is higher as compared with a conventional memory array using buried bit lines and buried source lines.

Moreover, since the non-volatile memory of this memory does not use buried bit lines, the sources/drains can be formed after the word lines are formed and the manufacturing process thus is more compatible with conventional CMOS process.

Furthermore, in this invention, an isolation can be formed between rows of memory cells, and spacers can be formed on the sidewalls of the gates of each memory cell. With the isolation and the spacers, the contacts between the sources/drains and source/drain lines can be formed as borderless contacts.

Moreover, since the source/drain line select transistors in the periphery circuit are coupled to the same global source/drain line, the select transistor array can be formed more compact. Consequently, the select lines of the select transistors can be formed wider to lower the resistance thereof.

On the other hand, a method for operating the aforementioned non-volatile memory of this invention is described as follows. In a programming operation, the word line, the drain line and the source line coupled to the selected memory cell are applied with a first positive voltage, a second positive voltage and 0V, respectively. The first positive voltage and the second positive voltage are sufficiently high to induce channel hot electron injection (CHEI) phenomenon for programming the drain side of the selected memory cell. In an erasing operation, the word line, the drain line and the source line coupled to the selected memory cell are applied with a first negative voltage, a third positive voltage and 0V, respectively. The difference between the first negative voltage and the third positive voltage is sufficiently large to induce band-to-band hot hole injection phenomenon for erasing the drain side of the selected memory cell.

The above method for operating the non-volatile memory of this invention further comprises the following steps. In the programming operation, the word line, the source line and the drain line coupled to the selected memory cell are applied with the first positive voltage, the second positive voltage and 0V, respectively. The bias configuration is capable of inducing channel hot electron injection phenomenon for programming the source side of the selected memory cell. In the erasing operation, the word line, the source line and the drain line coupled to the selected memory cell are applied with the first negative voltage, the third positive voltage and 0V, respectively. The bias configuration is capable of inducing band-to-band hot hole injection phenomenon for erasing the source side of the selected memory cell.

In the above method for operating the non-volatile memory of this invention, the programming operation is done by using channel hot electron injection, and the erasing operation by using band-to-band hot hole injection. Therefore, it is possible to specifically erase a single bit in a memory cell without interfering with the other bit in the same memory cell or the bits in other memory cells of the memory array. Moreover, by configuring the word lines, the global source line, the global drain line, the source line select lines and the drain line select lines in the method, the memory can be programmed or erased with a byte, a sector or a block as a unit.

Another method for operating the non-volatile memory of this invention is described as follows. In an erasing operation, the word line, the source line and the drain line coupled to the selected memory cell are applied with a first positive voltage, 0V and 0V, respectively. The first positive voltage is sufficiently high to induce Fowler-Nordheim tunneling phenomenon to simultaneously erase the source side and the drain side of the selected memory cell with electrons. In a programming operation, the word line, the drain line and the source line coupled to the selected memory cell are applied with a first negative voltage, a second positive voltage and 0V, respectively. The difference between the first negative voltage and the second positive voltage is sufficiently large to induce band-to-band hot hole injection phenomenon for programming the drain side of the selected memory cell.

The above method for operating the non-volatile memory of this invention further comprises the following steps. In the programming operation, the word line, the source line and the drain line coupled to the selected memory cell are applied with the first negative voltage, the second positive voltage and 0V, respectively. The bias configuration is capable of inducing band-to-band hot hole injection phenomenon for programming the source side of the selected memory cell.

In the above method for operating the non-volatile memory of this invention, the erasing operation is done by using Fowler-Nordheim tunneling, and the programming operation by using band-to-band hot hole injection. The erasing operation using Fowler-Nordheim tunneling is capable of erasing a column, a sector or a block of memory cells at the same time by controlling the word lines. Meanwhile, it is possible to specifically program a single bit in a memory cell without interfering with the other bit in the same memory or the bits in other memory cells of the memory array. Moreover, by configuring the word lines, the global source line, the global drain line, the source line select lines and the drain line select line in the programming operation, the memory can be programmed with a byte, a sector or a block as a unit.

It is to be understood that both the foregoing global description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Memory Structure

Figure 2A:
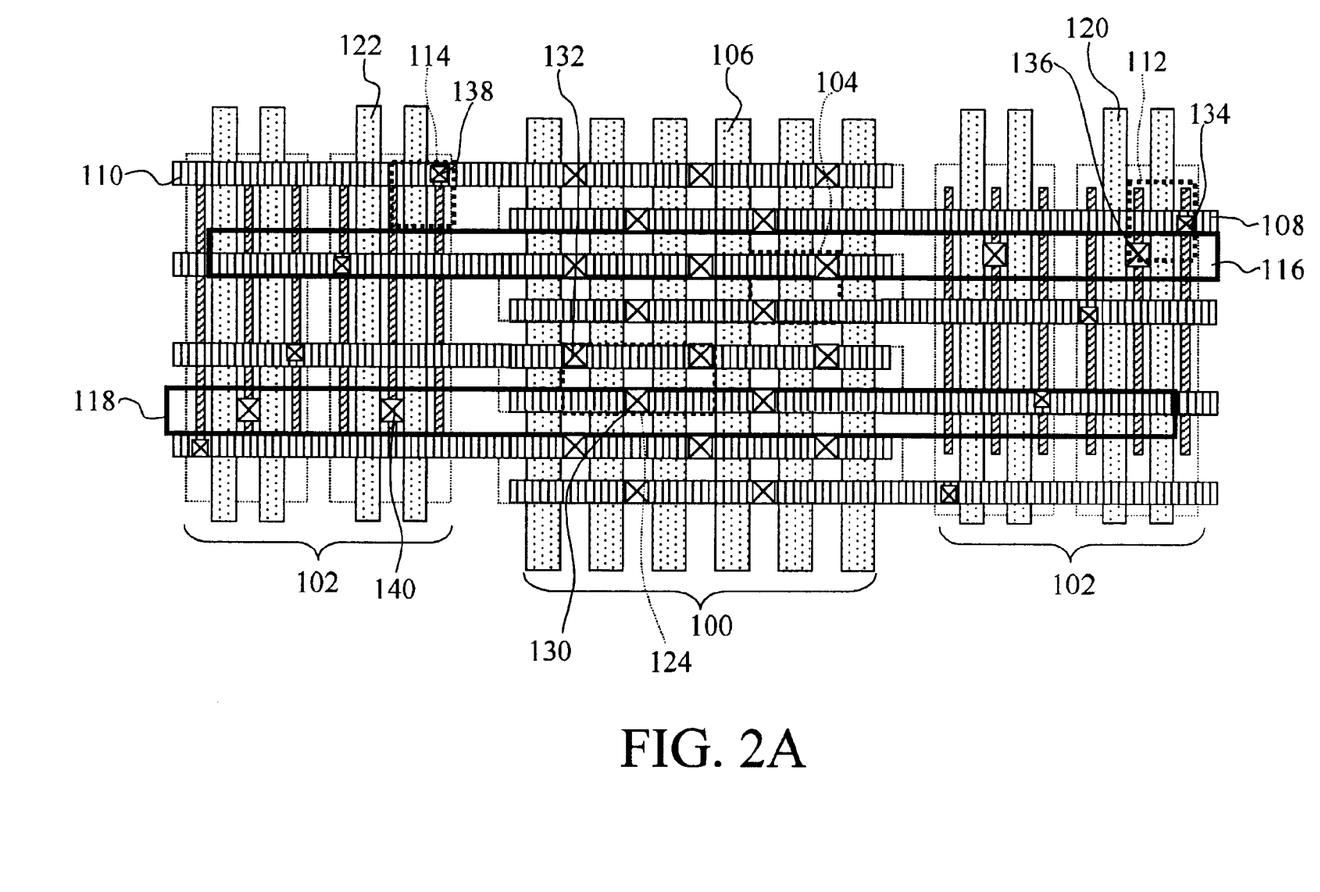
FIGS. 2A and 2B illustrate a top view and a cross-sectional view, respectively, of a non-volatile memory according to a preferred embodiment of this invention.
Figure 2B:
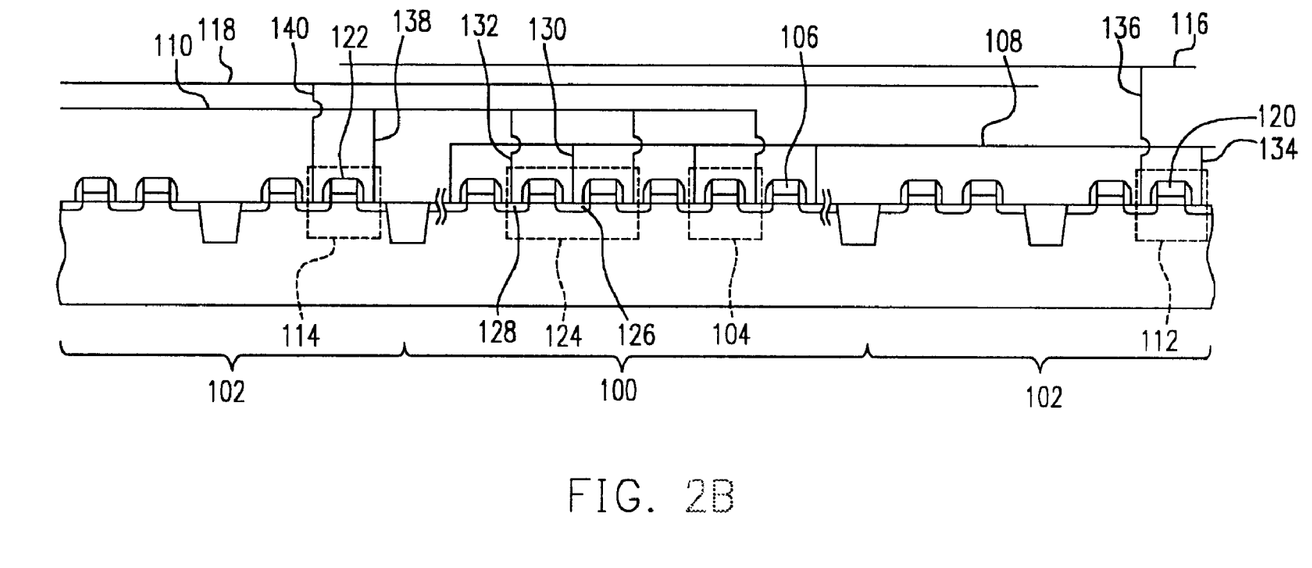

FIGS. 2A and 2B illustrate a top view and a cross-sectional view, respectively, of a non-volatile memory according to the preferred embodiment of this invention.

Refer to FIGS. 2A and 2B, the non-volatile memory of this embodiment is divided into a memory array region 100 and a periphery circuit region 102. The memory array region 100 comprises a plurality of memory cells 104, a plurality of word lines 106, a plurality of local source lines 108 and a plurality of local drain line 110. The local source lines 108 and the local drain line 110 both comprise a low-resistance material such as metal. The periphery circuit region 102 comprises a plurality of source line select transistors 112, a plurality of drain line select transistors 114, a global source line 116, a global drain line 118, a plurality of source line select lines 120 and a plurality of drain line select lines 122. The global source line 116 and the global drain line 118 both comprise a material such as metal.

In the memory array region 100, two memory cells 104 share a source 126 and are grouped as a cell pair 124, and all cell pairs 124 are arranged in rows and columns, wherein two cell pairs 124 in the same row share a drain 128 (See FIG. 2B). In each row of memory cells 104, the source 126 of each memory cell 104 is electrically connected to a local source line 108 via a contact 130, and the drain 128 of each memory cell 104 is electrically connected to a local drain line 110 via a contact 132. The control gates of the memory cells 104 in the same column are coupled to a word line 106. Each local source line 108 is electrically connected to a source line select transistor 112 via a contact 134, while the source line select transistor 112 is coupled to the global source line 116. via a contact 136. Each local drain line 110 is electrically connected to a drain line select transistor 114 via a contact 138, while the drain line select transistor 114 is coupled to the global drain line 118 via a contact 140. Meanwhile, the gate of each source line select transistor 112 is coupled to a source line select line 120, and the gate of each drain line select transistor 114 is coupled to a drain line select line 122.

As mentioned above, the sources/drains 126/128 of the memory cells 104 in the same row are electrically connected to a local metal source/drain line 108/110 via the contacts 130/132 in the non-volatile memory of this embodiment. Therefore, as compared with the conventional memory array using buried bit lines and buried source lines, the resistance of the present memory array is lower and the operating speed is higher.

Moreover, since the non-volatile memory of this embodiment does not use buried bit lines, the sources 126 and the drains 128 can be formed after the word lines 106 are formed, and the manufacturing process thus is more compatible with conventional CMOS process.

Furthermore, with the isolation between rows of memory cells 104 and the spacers on the sidewalls of the gates of the memory cells 104 (See FIG. 2B), the contacts 130/132 between the sources/drains 126/128 and local metal source/drain lines 108/110 can be formed as borderless contacts.

Moreover, the source/drain line select transistors 112/114 in the periphery circuit region 102 are coupled to the same global source/drain line 116/118. Therefore, the select transistor array can be formed more compact, and the select lines 120/122 of the source/drain select transistors 112/114 can be formed wider to lower the resistance thereof.

Figure 3:
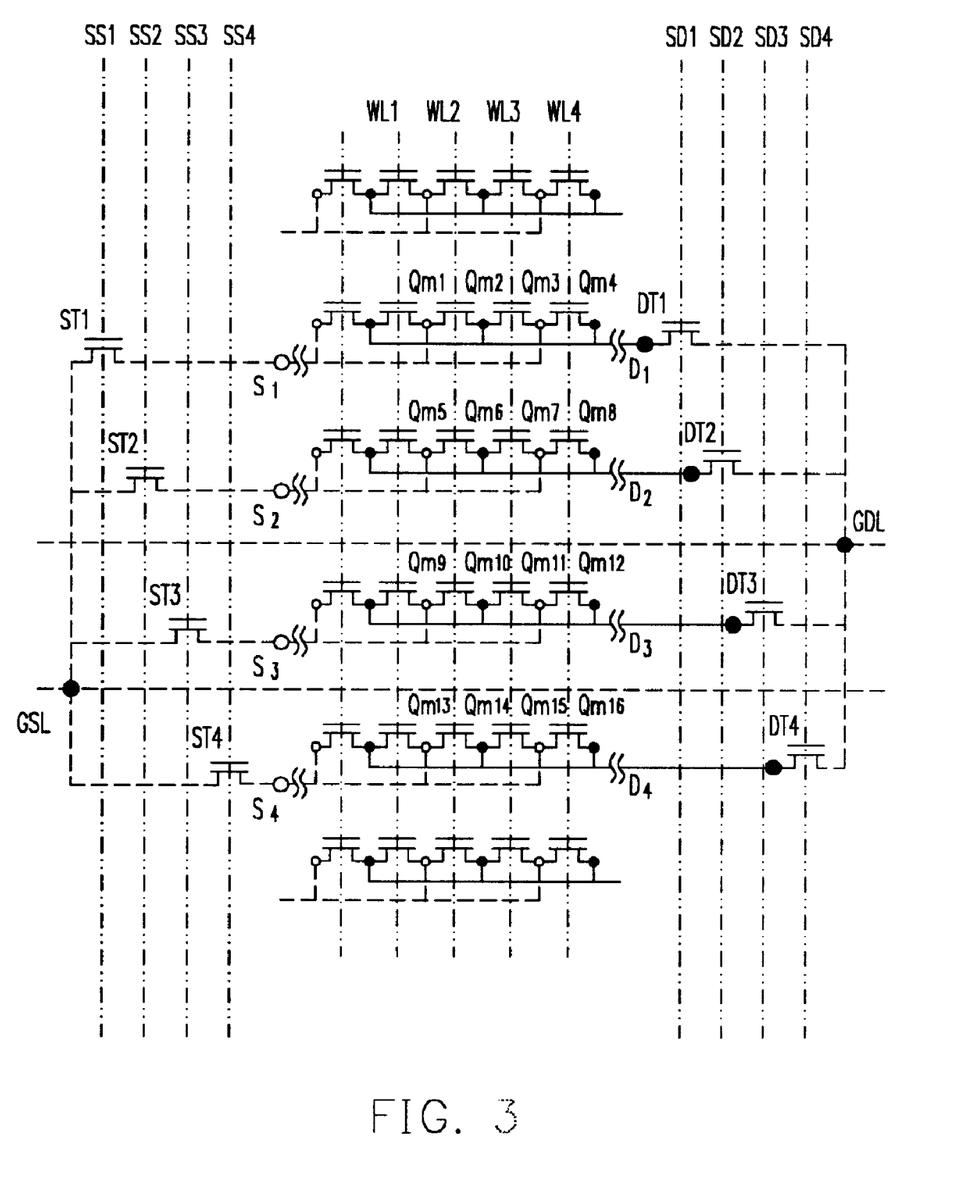
FIG. 3 schematically illustrates a circuit diagram of a non-volatile memory according to the preferred embodiment of this invention.

FIG. 3 schematically illustrates a circuit diagram of a non-volatile memory according to the preferred embodiment of this invention, wherein a 4×4 memory array including memory cells Qm1~Qm16 is shown as an example. Meanwhile, word lines WL1~WL4, local source lines S1~S4, local drain lines D1~D4, source line select transistors ST1~ST4, drain line select transistors DT1~DT4, a global source line GSL, a global drain line GDL, source line select lines SS1~SS4 and drain line select lines SD1~SD4 for operating Qm1~Qm16 are also depicted.

The configuration of the memory cells Qm1~Qm4 are described as an example. Qm1 and Qm2 share a source and are grouped as a cell pair, and Qm3 and Qm4 are grouped as another cell pair sharing another source, while Qm2 and Qm3 that are in different cell pairs share a drain. Meanwhile, the sources of Qm1~Qm4 are electrically connected to the local source line S1 that is coupled to the global source line GSL via the source line select transistor ST1, while the gate of ST1 is coupled to the source line select line SS1. The drains of Qm1~Qm4 are electrically connected to the local drain line D1 that is coupled to the global drain line GDL via the drain line select transistor DT1, while the gate of DT1 is coupled to the drain line select line SD1. The configurations of Qm5~Qm8 in the second row, Qm9~Qm12 in the third row and Qm13~Qm16 in the fourth row are analogous to that of Qm1~Qm4, and are described below.

The sources of Qm5~Qm8 are electrically connected to the local source line S2 that is coupled to the global source line GSL via the source line select transistor ST2, while the gate of ST2 is coupled to the source line select line SS2. The drains of Qm5~Qm8 are electrically connected to the local drain line D2 that is coupled to the global drain line GDL via the drain line select transistor DT2, while the gate of DT2 is coupled to the drain line select line SD2.

The sources of Qm9~Qm12 are electrically connected to the local source line S3 that is coupled to the global source line GSL via the source line select transistor ST3, while the gate of ST3 is coupled to the source line select line SS3. The drains of Qm9~Qm12 are electrically connected to the local drain line D3 that is coupled to the global drain line GDL via the drain line select transistor DT3, while the gate of DT3 is coupled to the drain line select line SD3.

The sources of Qm13~Qm16 are electrically connected to the local source line S4 that is coupled to the global source line GSL via the source line select transistor ST4, while the gate of ST4 is coupled to the source line select line SS4. The drains of Qm13~Qm16 are electrically connected to the local drain line D4 that is coupled to the global drain line GDL via the drain line select transistor DT4, while the gate of DT4 is coupled to the drain line select line SD4.

Moreover, the memory cells in the same column are coupled to a word line. In detail, Qm1, Qm5, Qm9 and Qm13 are coupled to WL1, Qm2, Qm6, Qm10 and Qm14 to WL2, Qm3, Qm7, Qm11 and Qm15 to WL3, and Qm4, Qm8, Qm12 and Qm16 to WL4.

First Operating Method of the Memory

Figure 4A:
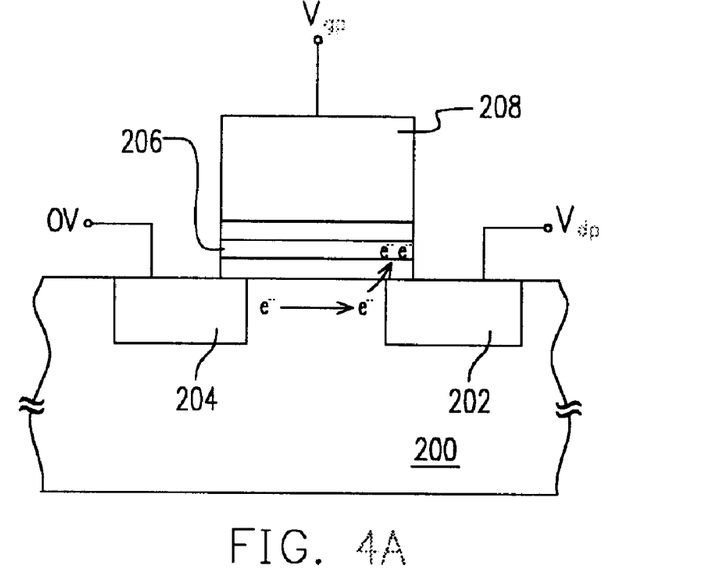
FIGS. 4A and 4B schematically illustrate a first programming method and a first erasing method, respectively, of the non-volatile memory according to the preferred embodiment of this invention.
Figure 4B:
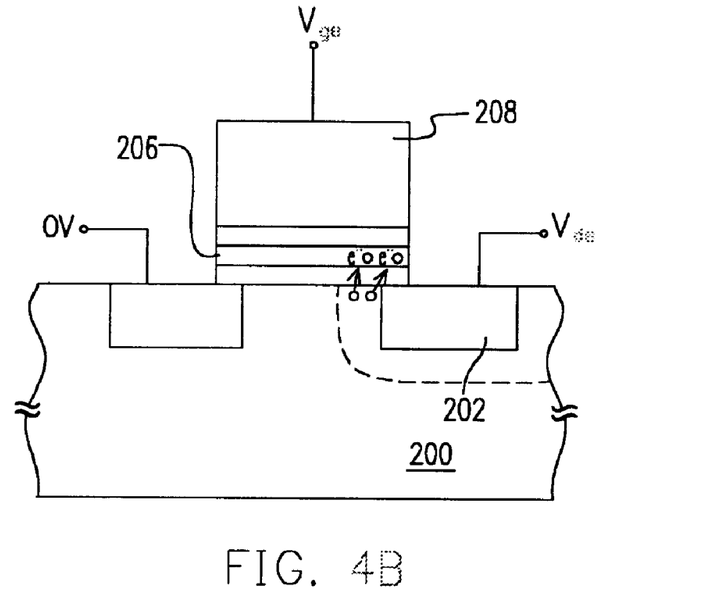

Refer to FIGS. 4A and 4B to understand the first programming method and the first erasing method, respectively, of the non-volatile memory according to the preferred embodiment of this invention, wherein the memory cell Qm6 in FIG. 3 is taken as an example. The bias configurations for programming, reading, and erasing operations are listed in Table 1. In this method, the programming operation is done by using channel hot electron injection, and the erasing operation by using band-to-band hot hole injection.

TABLE 1

|  | Programming | | Reading | | Erasing | |
| --- | --- | --- | --- | --- | --- | --- |
|  | Drain side | Source side | Drain side | Source side | Drain side | Source side |
| Selected word line WL2 | +Vgp | +Vgp | +Vcc | +Vcc | −Vge | −Vge |
| Unselected word lines WL1, WL3, WL4 | 0 | 0 | 0 | 0 | 0 | 0 |
| Global source line (GSL) | 0 | +Vsp | +Vsr | 0 | 0 | +Vse |
| Global drain line (GDL) | +Vdp | 0 | 0 | +Vdr | +Vde | 0 |
| Selected source line select line SS2 | Vst | Vst | Vst | Vst | Vst | Vst |
| Unselected source line select lines SS1, SS3, SS4 | 0 | 0 | 0 | 0 | 0 | 0 |
| Selected drain line select line SD2 | Vdt | Vdt | Vdt | Vdt | Vdt | Vdt |
| Unselected drain line select lines SD1, SD3, SD4 | 0 | 0 | 0 | 0 | 0 | 0 |

Since the programming, reading, and erasing operations for the source side of a memory cell are similar to those for the drain side except the bias voltages on the source and on the drain are exchanged, only the operations for the drain side are described as an example.

As shown in Table 1 and FIGS. 4A and 4B, the drain side of the memory cell Qm6 is being programmed with channel hot electron injection (CHEI). The gate 208 (selected word line WL2) is applied with a positive bias Vgp, such as 10V, the drain 202 is applied with a positive bias Vdp, such as 4.5V, from the global drain line (GDL), and the source 204 is applied with 0V from the global source line (GSL). With such a bias configuration, a large channel current of about 0.25~1 mA/cell is generated consisting of an electron flow from the source 204 toward the drain 202. The electrons are accelerated by the high electric field near the drain 202 to produce hot electrons. The hot electrons have sufficient energy to overcome the barrier height of the tunnel oxide to be injected into the charge-trapping layer 206 with the aid of the high positive voltage (e.g., 10V) on the control gate 208. Thus, the injected electrons are localized in the charge-trapping layer 206 near the drain 202, as shown in FIG. 4. Since net negative charges are present in the charge-trapping layer 206 near the drain 202 after programming, the memory cell has a high-level threshold voltage ($V_T$). The electrons will stay in the charge-trapping layer 206 for a long period unless the NROM are erased purposely. For example, the elections will be trapped in the charge-trapping layer 206 over 10 years at 85 degrees Celsius.

On the other hand, when the data on the drain side of the memory cell Qm6 is being read, the source 204 is applied with a positive bias Vsr, such as 1.5V, from the global source line GSL. The control gate 208 (selected word line WL2) is applied with Vcc of about 3V, and the drain 202 is applied with 0V from the global drain line GDL. If electrons are present in the charge-trapping layer 206 near the drain 202, the channel cannot be switched on and the channel current is extremely small. On the contrary, if electrons are absent in the charge-trapping layer 206 near the drain 202, the channel can be switched on and the channel current is large. Thus, the data stored on the drain side of the memory cell Qm6 can be identified.

When the drain side of the memory cell Qm6 is being erased with band-to-band hot hole injection, the control gate 208 (selected word line WL2) is applied with a negative bias Vge, such as 5V. The drain 202 is applied with a positive bias Vde, such as 5V, from the global drain line GDL, and the source 204 is applied with 0V from the global source line GSL. With this bias configuration, deep depletion phenomenon is induced around the drain 202 under the gate 208, wherein electron-hole pairs are generated and separated. The holes are accelerated by the high electric field perpendicular to the tunnel oxide to generate hot holes, which have sufficient energy to overcome the barrier height of the tunnel oxide to be injected into the charge-trapping layer 206 near the drain 202, as shown in FIG. 4B. Since the electrons originally in the charge-trapping layer 206 recombine with the holes in the erasing operation, the threshold voltage of the memory cell Qm6 is lowered to the low level.

Refer to FIG. 3 to understand the operations of the periphery circuit for programming or erasing a single bit of a memory cell, wherein the memory cell Qm6 is taken as an example. To program the drain side of Qm6, the selected word line WL2 is applied with a positive bias Vgp, such as 10V, and the unselected word lines WL1, WL3 and WL4 are applied with 0V. The global drain line GDL is applied with a positive bias Vdp, such as 4.5V, and the global source line GSL is applied with 0V. The drain line select line SD2 is applied with a positive bias Vdt, such as 10V, and the source line select line SS2 is applied with a positive bias Vst, such as 10V. The unselected drain line select lines SD1, SD3 and SD4 and the unselected source line select lines SS1, SS3 and SS4 are all biased to 0V. Thus, the channel of the drain line select transistor DT2 is switched on to electrically connect the local drain line D2 to the global drain line GDL, and the channel of the source line select transistor ST2 is switched on to electrically connect the local source line S2 to the global source line GSL. Consequently, channel hot electrons are generated and injected into the charge-trapping layer from the drain side, and the memory cell Qm6 is in a written state having a high-level threshold voltage.

In the above programming operation, the unselected memory cells Qm5, Qm7 and Qm8 are not programmed since WL1, WL3 and WL4 are applied with 0V and the channels of Qm5, Qm7 and Qm8 cannot be switched on for producing channel hot electrons. Meanwhile, since the unselected drain line select lines SD1, SD3 and SD4 are biased with 0V, the channels of the drain line select transistors DT1, DT3 and DT4 are not switched on to electrically connect the local drain lines D1, D3 and D4 to the global drain line GDL. Therefore, the drains of the memory cells Qm1~Qm4 and Qm9~QM16 are all floated, and channel hot electrons necessary for programming are not generated.

To erase the drain side of Qm6, the selected word line WL2 is applied with a negative bias Vge, such as 5V, the unselected word lines WL1, WL3 and WL4 are applied with 0V. The global drain line GDL is applied with a positive bias Vdp, such as 5V, and the global source line GSL is applied with 0V. The drain line select line SD2 is applied with a positive bias Vdt, such as 10V, and the source line select line SS2 is applied with a positive bias Vst, such as 10V. The unselected drain line select lines SD1, SD3 and SD4 and the unselected source line select lines SS1, SS3 and SS4 are biased to 0V. Thus, the channel of the drain line select transistor DT2 is switched on to electrically connect the local drain line D2 to the global drain line GDL, and the channel of the source line select transistor ST2 is switched on to electrically connect the local source line S2 to the global source line GSL. Consequently, band-to-band hot holes can be generated and injected into the charge-trapping layer from the drain side, and the memory cell Qm6 is in an erased state with a low-level threshold voltage.

In the above erasing operation, the unselected memory cells Qm5, Qm7 and Qm8 are not erased since WL1, WL3 and WL4 are applied with 0V and the voltage difference is insufficient to cause the band-to-band hot hole injection phenomenon for erasing. Meanwhile, since the unselected drain line select lines SD1, SD3 and SD4 are biased with 0V, the channels of the drain line select transistors DT1, DT3 and DT4 are not switched on to electrically connect the local drain lines D1, D3 and D4 to the global drain line GDL. Therefore, the drains of the memory cells Qm1~Qm4 and Qm9~QM16 are all floated, and band-to-band hot holes necessary for erasing are not generated.

In the above programming and erasing operations, it is possible to program or erase a single bit in a memory cell without interfering with the other bit in the same memory cell or the bits in other memory cells of the memory array. However, the erasing method is not restricted to the aforementioned single-bit erasing mode. By configuring the word lines, the global source and drain lines, the source line select lines and the drain line select lines to control the programming or erasing operation, the memory can be programmed or erased with a byte, a sector or a block as a unit.

Second Operating Method of the Memory

Figure 5A:
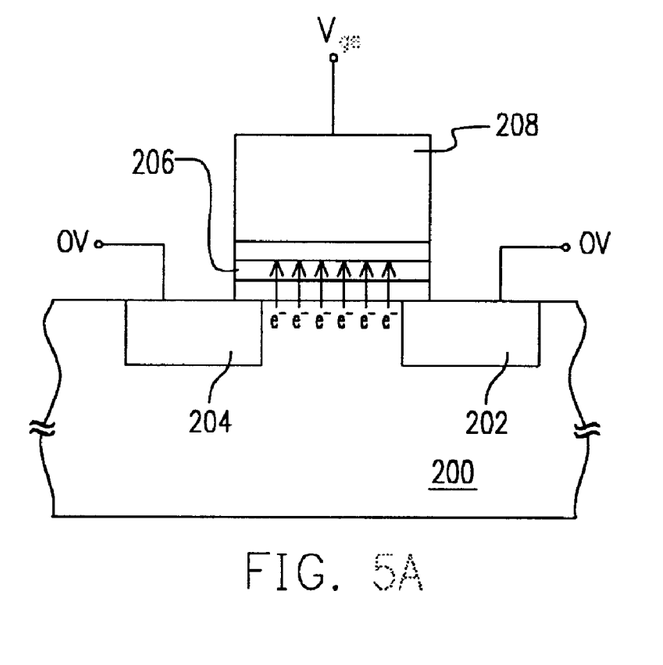
FIGS. 5A and 5B schematically illustrate a second erasing method and a second programming method, respectively, of the non-volatile memory according to the preferred embodiment of this invention.
Figure 5B:
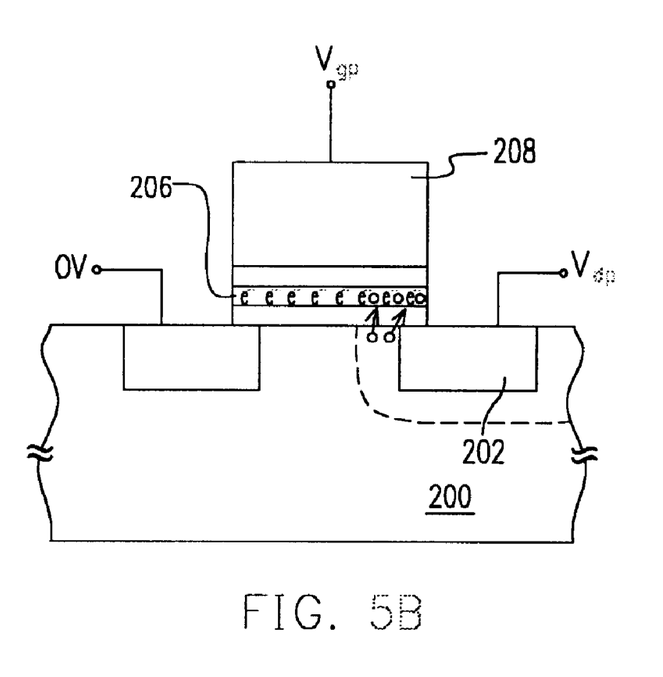

Refer to FIGS. 5A and 5B to understand the second erasing method and the second programming method, respectively, of the non-volatile memory according to the preferred embodiment of this invention, wherein the memory cell Qm6 in FIG. 3 is still taken as an example. The bias configurations for programming, reading, and erasing operations are listed in Table 2. In this case, the programming operation is done by using band-to-band hot hole injection, and the erasing operation by using Fowler-Nordheim tunneling.

TABLE 2

|  | Programming | | Reading | | Erasing | |
| --- | --- | --- | --- | --- | --- | --- |
|  | Drain side | Source side | Drain side | Source side | Drain side | Source side |
| Selected word line WL2 | −Vgp | −Vgp | +Vcc | +Vcc | +Vge | +Vge |
| Unselected word lines WL1, WL3, WL4 | 0 | 0 | 0 | 0 | 0 | 0 |
| Global source line GSL | 0 | +Vse | +Vsr | 0 | 0 | 0 |
| Global drain line GDL | +Vde | 0 | 0 | +Vdr | 0 | 0 |
| Selected source line select line SS2 | Vst | Vst | Vst | Vst | 0 | 0 |
| Unselected source line select lines SS1, SS3, SS4 | 0 | 0 | 0 | 0 | 0 | 0 |
| Selected drain line select line SD2 | Vdt | Vdt | Vdt | Vdt | 0 | 0 |
| Unselected drain line select lines SD1, SD3, SD4 | 0 | 0 | 0 | 0 | 0 | 0 |

Refer to Table 2 and FIGS. 5A and 5B, to erase the memory cell Qm6, the gate 208 (selected word line WL2) is applied with a high positive bias Vge, such as 18V. The drain 202 is applied with 0V from the global drain line GDL, and the source 204 is applied with 0V from the global source line GSL. Thus, a large electric field is established between the gate 208 and the substrate 200 to cause Fowler-Nordheim tunneling phenomenon and inject electrons into the charge-trapping layer 206. The charge-trapping layer 206 therefore carries net negative charges, and memory cell Qm6 has a high-level threshold voltage.

To program the drain side of the memory cell Qm6, the gate 208 (selected word line WL2) is applied with a negative bias Vgp, such as 5V. The drain 202 is applied with 5V from the global drain line GDL, and the source 204 is applied with 0V from the global source line GSL. With this bias configuration, deep depletion phenomenon is induced around the drain 202 under the gate 208, wherein electron-hole pairs are generated and separated. The holes are accelerated by the high electric field perpendicular to the tunnel oxide to generate hot holes, which have sufficient energy to overcome the barrier height of the tunnel oxide to be injected into the charge-trapping layer 206 near the drain 202, as shown in FIG. 5B. After the programming operation, the memory cell Qm6 has a low-level threshold voltage because the negative charges originally in the charge-trapping layer 206 near the drain 202 are neutralized by the injected holes.

When the drain side of the memory cell Qm6 is being read, the source 204 is applied with a positive bias Vsr, such as 1.5V, from the global source line GSL. The control gate 208 (selected word line WL2) is applied with Vcc, and the drain 202 is applied with 0V from the global drain line GDL. If the electrons in the charge-trapping layer 206 near the drain 202 are not neutralized, the channel cannot be switched on and the channel current is extremely small. On the contrary, if the electrons in the charge-trapping layer 206 near the drain 202 have been neutralized, the channel can be switched on and the channel current is large. Thus, the data (0/1) stored on the drain side of the memory cell can be identified.

Refer to FIG. 3 again to understand the operations of the periphery circuit for programming and erasing a memory cell, wherein the memory cell Qm6 is taken as an example. To erase Qm6, the selected word line WL2 is applied with a high positive bias Vge, such as 18V, the unselected word lines WL1, WL3 and WL4 are applied with 0V. The global drain line GDL and the global source line GSL are applied with 0V, and the drain line select lines SD1~SD4 and the source line select lines SS1~SS4 are biased to 10V. Thus, the Fowler-Nordheim tunneling phenomenon is induced, and electrons are injected unto the charge-trapping layer 206. Consequently, Qm6 is in an erased state having a high-level threshold voltage.

During the above erasing operation, the memory cells are erased with a column as a unit, and the drain side and the source side of the same memory cell are erased simultaneously. That is, the drain sides and the source sides of the memory cells Qm2, Qm6, Qm10 and Qm14 coupled to the same word line WL2 are erased simultaneously. However, since the unselected word lines WL1, WL3 and WL4 are all biased with 0V, the memory cells Qm1, Qm3~Qm5, Qm7~Qm9, Qm11~Qm13, Qm15~Qm16 are not erased.

When the drain side of the memory cell Qm6 is being programmed with band-to-band hot hole injection, the selected word line WL2 is applied with a negative bias Vgp, such as 5V, and the unselected word lines WL1, WL3 and WL4 are applied with 0V. The global drain line GDL is applied with a positive bias Vdp, such as 5V, and the global source line GSL is applied with 0V. The drain line select line SD2 is applied with a positive bias Vdt, such as 10V, and the source line select line SS2 is applied with a positive bias Vst, such as 10V. The unselected drain line select lines SD1, SD3 and SD4 and the unselected source line select lines SS1, SS3 and SS4 are all biased to 0V. Thus, the channel of the drain line select transistor DT2 is switched on to electrically connect the local drain line D2 to the global drain line GDL, and the channel of the source line select transistor ST2 is switched on to electrically connect the local source line S2 to the global source line GSL. Consequently, band-to-band hot holes are generated and injected into the charge-trapping layer from drain side, and the memory cell Qm6 is in a written state with a low-level threshold voltage.

During the above programming operation, the memory cells Qm5, Qm7 and Qm8 are not programmed because the unselected word lines WL1, WL3 and WL4 are all biased with 0V and band-to-band hot holes necessary for programming cannot be generated. Meanwhile, since the unselected drain line select lines SD1, SD3 and SD4 are biased with 0V, the channels of the drain line select transistors DT1, DT3 and DT4 are not switched on to electrically connect the local drain lines D1, D3 and D4 to the global drain line GDL. Therefore, the drains of the memory cells Qm1~Qm4 and Qm9~QM16 are all floated, and band-to-band hot holes necessary for programming are not generated.

In the above method for operating the memory of this invention, the programming operation is done by using band-to-band hot hole injection, and the erasing operation by using Fowler-Nordheim tunneling. The erasing operation using Fowler-Nordheim tunneling is capable of erasing a column, a sector or a block of memory cells at the same time by controlling the word lines. Meanwhile, it is possible to specifically program a single bit in a memory cell without interfering the other bit in the same memory or the bits in other memory cells of the memory array. Moreover, by configuring the word lines, the global source line, the global drain line, the source line select lines and the drain line select line to control the programming operation, the memory can be programmed with a byte, a sector or a block as a unit.

According to the preferred embodiment of this invention, the non-volatile memory uses a pair of symmetric local source line and local drain line to connect the sources and the drains, respectively, of the memory cells in the same row. Therefore, this invention is suitably applied to a flash memory device that stores 2 bits in one cell with charge-trapping mechanism, such as NROM. Moreover, in the non-volatile memory array, the sources/drains of the memory cells in the same row are electrically connected to a local metal source/drain line via contacts. Therefore, as compared with the conventional memory array using buried bit lines, the resistance of the memory array is lower and the operating speed is higher.

Moreover, since the non-volatile memory of this memory does not use buried bit lines and buried source lines, the sources/drains can be formed after the word lines are formed and the manufacturing process is more compatible with conventional CMOS process.

Furthermore, with the isolation between rows of memory cells and the spacers on the sidewalls of the gates of the memory cells, the contacts between the sources/drains and local source/drain lines can be formed as borderless contacts.

Moreover, since all of the source/drain line select transistors in the periphery circuit are coupled to the same global source/drain line, the select transistor array can be formed more compact. Therefore, the select lines of the select transistors can be formed wider to lower the resistance thereof On the other hand, in the first method for operating the non-volatile memory of this invention, the programming operation is done by using channel hot electron injection, and the erasing operation by using band-to-band hot hole injection. Therefore, it is possible to specifically erase a single bit in a memory cell without interfering with the other bit in the same memory or the bits in other memory cells of the memory array. Moreover, by configuring the word lines, the global source and drain lines, the source line select lines and the drain line select line to control the programming or erasing operation, the memory can be programmed or erased with a byte, a sector or a block as a unit.

Besides, in the second method for operating the non-volatile memory of this invention, the erasing operation is done by using Fowler-Nordheim tunneling, and the programming operation by using band-to-band hot hole injection. The erasing operation using Fowler-Nordheim tunneling is capable of erasing a column, a sector or a block of memory cells at the same time by controlling the word lines. Meanwhile, it is possible to specifically program a single bit in a memory cell without interfering with the other bit in the same memory or the bits in other memory cells of the memory array. Moreover, by configuring the word lines, the global source line, the global drain line, the source line select lines and the drain line select line to control the programming operation, the memory can be programmed with a byte, a sector or a block as a unit.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A non-volatile memory, comprising:
    a plurality of memory cells, a plurality of word lines, a plurality of drain lines and a plurality of source lines, wherein
        two adjacent memory cells in a row share a source and are grouped into a cell pair, while the memory cells are divided into a plurality of cell pairs arranged in rows and columns, and two adjacent cell pairs in a row share a drain;
        the sources of the memory cells in the same row are connected to a source line;
        the drains of the memory cells in the same row are connected to a drain line; and
        the gates of the memory cells in the same column are coupled to a word line.

2. The non-volatile memory of claim 1, wherein a source is coupled to a source line via a first contact, and a drain is coupled to a drain line via a second contact.

3. The non-volatile memory of claim 1, further comprising a plurality of source line select transistors, a plurality of drain line select transistors, a global source line and a global drain line, wherein
    each source line select transistor is coupled between the global source line and a source line; and
    each drain line select transistor is coupled between the global drain line and a drain line.

4. The non-volatile memory of claim 3, further comprising a plurality of source line select lines and a plurality of drain line select lines, wherein
    a gate of a source line select transistor is coupled to a source line select line; and
    a gate of a drain line select transistor is coupled to a drain line select line.

5. The non-volatile memory of claim 3, wherein each source line is coupled to a source line select transistor via a third contact, and the source line select transistor is coupled to the global source line via a fourth contact.

6. The non-volatile memory of claim 3, wherein each drain line is coupled to a drain line select transistor via a fifth contact, and the drain line select transistor is coupled to the global drain line via a sixth contact.

7. A method for operating a non-volatile memory, the non-volatile memory comprising a plurality of memory cells, a plurality of word lines, a plurality of drain lines and a plurality of source lines, wherein two adjacent memory cells in a row share a source and are grouped into a cell pair, while the memory cells are divided into a plurality of cell pairs arranged in rows and columns, and two adjacent cell pairs in a row share a drain;

the sources of the memory cells in the same row are connected to a source line;

the drains of the memory cells in the same row are connected to a drain line; and the gates of the memory cells in the same column are coupled to a word line, the method comprising:

during a programming operation of a selected memory cell, applying a first positive voltage to the word line coupled to the selected memory cell, applying a second positive voltage to the drain line coupled to the selected memory cell, and applying 0V to the source line coupled to the selected memory cell, wherein the first positive voltage and the second positive voltage are sufficiently high to induce channel hot electron injection phenomenon for programming a drain side of the selected memory cell; and during an erasing operation of the selected memory cell, applying a first negative voltage to the word line coupled to the selected memory cell, applying a third positive voltage to the drain line coupled to the selected memory cell, and applying 0V to the source line coupled to the selected memory cell, wherein a difference between the first negative voltage and the third positive voltage is sufficiently large to induce band-to-band hot hole injection phenomenon for erasing the drain side of the selected memory cell.

8. The method of claim 7, wherein the programming operation further comprises applying the first positive voltage to the word line coupled to the selected memory cell, applying the second positive voltage to the source line coupled to the selected memory cell, and applying 0V to the drain line coupled to the selected memory cell, so as to induce channel hot electron injection phenomenon for programming a source side of the selected memory cell; and the erasing operation further comprises applying the first negative voltage to the word line coupled to the selected memory cell, applying the third positive voltage to the source line coupled to the selected memory cell, and applying 0V to the drain line coupled to the selected memory cell, so as to induce band-to-band hot hole injection phenomenon for erasing the source side of the selected memory cell.

9. The method of claim 7, wherein the first positive voltage is about 10V.

10. The method of claim 7, wherein the second positive voltage is about 4.5V.

11. The method of claim 7, wherein the first negative voltage is about 5V.

12. The method of claim 7, wherein the third positive voltage is about 5V.

13. The method of claim 7, wherein each drain line is electrically connected to a drain line select transistor that is electrically connected to a global drain line and has a gate coupled to a drain line select line; and each source line is electrically connected to a source line select transistor that is electrically connected to a global source line and has a gate coupled to a source line select line, the method further comprising:

in the programming operation, applying the second positive voltage to the global drain line, applying 0V to the global source line, applying a fourth positive voltage to the drain line select line to switch on a channel of the drain line select transistor and thereby connect the drain line to the global drain line, and applying a fifth positive voltage to the source line select line to switch on a channel of the source line select transistor and thereby connect the source line to the global source line; and in the erasing operation, applying the third positive voltage to the global drain line, applying 0V to the global source line, applying the fourth positive voltage to the drain line select line to switch on the channel of the drain line select transistor and thereby connect the drain line to the global drain line, and applying the fifth positive voltage to the source line select line to switch on a channel of the source line select transistor and thereby connect the source line to the global source line.

14. The method of claim 13, wherein the fourth positive voltage and the fifth positive voltage are both about 10V.

15. The method of claim 8, wherein each drain line is electrically connected to a drain line select transistor that is electrically connected to a global drain line and has a gate coupled to a drain line select line; and each source line is electrically connected to a source line select transistor that is electrically connected to a global source line and has a gate coupled to a source line select line, the method further comprising:

in the programming operation, applying the second positive voltage to the global source line, applying 0V to the global drain line, applying a fourth positive voltage to the source line select line to switch on a channel of the source line select transistor and thereby connect the source line to the global source line, and applying a fifth positive voltage to the drain line select line to switch on a channel of the drain line select transistor and thereby connect the drain line to the global drain line; and in the erasing operation, applying the third positive voltage to the global source line, applying 0V to the global drain line, applying the fourth positive voltage to the source line select line to switch on the channel of the source line select transistor and thereby connect the source line to the global source line, and applying the fifth positive voltage to the drain line select line to switch on a channel of the drain line select transistor and thereby connect the drain line to the global drain line.

16. A method for operating a non-volatile memory, the memory comprising a plurality of memory cells, a plurality of word lines, a plurality of drain lines and a plurality of source lines, wherein two adjacent memory cells in a row share a source and are grouped into a cell pair, while the memory cells are divided into a plurality of cell pairs arranged in rows and columns, and two adjacent cell pairs in a row share a drain;

the sources of the memory cells in the same row are connected to a source line;

the drains of the memory cells in the same row are connected to a drain line; and the gates of the memory cells in the same column are coupled to a word line, the method comprising:

during an erasing operation of a selected memory cell, applying a first positive voltage to the word line coupled to the selected memory cell, and applying 0V to the drain line and the source line coupled to the selected memory cell, wherein the first voltage is sufficiently high to induce Fowler-Nordheim tunneling phenomenon for erasing a drain side and a source side of the selected memory cell; and during an programming operation of the selected memory cell, applying a first negative voltage to the word line coupled to the selected memory cell, applying a second positive voltage to the drain line coupled to the selected memory cell, and applying 0V to the source line coupled to the selected memory cell, wherein a difference between the first negative voltage and the second positive voltage is sufficiently large to induce band-to-band hot hole injection phenomenon for programming the drain side of the selected memory cell.

17. The method of claim 16, wherein the programming operation further comprises:

applying the first negative voltage to the word line coupled to the selected memory cell, applying the second positive voltage to the source line coupled to the selected memory cell, and applying 0V to the drain line coupled to the selected memory cell, so as to induce band-to-band hot hole injection phenomenon for programming the source side of the selected memory cell.

18. The method of claim 16, wherein the first positive voltage is about 18V.

19. The method of claim 16, wherein the first negative voltage is about 5V.

20. The method of claim 16, wherein the second positive voltage is about 5V.

21. The method of claim 16, wherein each drain line is electrically connected to a drain line select transistor that is electrically connected to a global drain line and has a gate coupled to a drain line select line; and each source line is electrically connected to a source line select transistor that is electrically connected to a global source line and has a gate coupled to a source line select line, the method further comprising:

in the programming operation, applying the second positive voltage to the global drain line, applying 0V to the global source line, applying a third positive voltage to the drain line select line to switch on a channel of the drain line select transistor and thereby connect the drain line to the global drain line, and applying a fourth positive voltage to the source line select line to switch on a channel of the source line select transistor and thereby connect the source line to the global source line.

22. The method of claim 21, wherein the third positive voltage and the fourth positive voltage are both about 10V.

23. The method of claim 17, wherein each drain line is electrically connected to a drain line select transistor that is electrically connected to a global drain line and has a gate coupled to a drain line select line; and each source line is electrically connected to a source line select transistor that is electrically connected to a global source line and has a gate coupled to a source line select line, the method further comprising:

in the programming operation, applying the second positive voltage to the global source line, applying 0V to the global drain line, applying a third positive voltage to the source line select line to switch on a channel of the source line select transistor and thereby connect the source line to the global source line, and applying a fourth positive voltage to the drain line select line to switch on a channel of the drain line select transistor and thereby connect the drain line to the global drain line.

* * * * *